(12) United States Patent
Bieg

(10) Patent No.: US 10,606,179 B2
(45) Date of Patent: Mar. 31, 2020

(54) PROJECTION EXPOSURE APPARATUS FOR SEMICONDUCTOR LITHOGRAPHY WITH REDUCE THERMAL DEFORMATION

(71) Applicant: Carl Zeiss SMT GmbH, Oberkochen (DE)

(72) Inventor: Hermann Bieg, Huettlingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/368,278

(22) Filed: Mar. 28, 2019

(65) Prior Publication Data

US 2019/0219935 A1 Jul. 18, 2019

Related U.S. Application Data

(63) Continuation of application No. PCT/EP2017/072982, filed on Sep. 13, 2017.

(30) Foreign Application Priority Data

Oct. 6, 2016 (DE) .................. 10 2016 219 357

(51) Int. Cl.
*G03F 7/20* (2006.01)
*G02B 7/18* (2006.01)

(52) U.S. Cl.
CPC ....... *G03F 7/70891* (2013.01); *G02B 7/1815* (2013.01); *G03F 7/7015* (2013.01)

(58) Field of Classification Search
CPC . G03F 7/70825; G03F 7/70891; G02B 7/181; G02B 7/1815; G02B 26/083
See application file for complete search history.

(56) References Cited

U.S. PATENT DOCUMENTS 4,143,946 A     3/1979  Leo et al.
2010/0200777 A1*  8/2010  Hauf .................. G02B 7/1815
                                         250/504 R
(Continued)

FOREIGN PATENT DOCUMENTS

DE   10 2005 053 415 A1   5/2007
DE   10 2010 034 476 A1   2/2012
(Continued)

OTHER PUBLICATIONS

German Office Action, with translation thereof, for corresponding DE Appl No. 10 2016 219 357.0, dated May 9, 2017.
(Continued)

*Primary Examiner* — Steven Whitesell Gordon
(74) *Attorney, Agent, or Firm* — Fish & Richardson P.C.

(57) ABSTRACT

A projection exposure apparatus for semiconductor lithography has a mirror arrangement that is exposed to thermal loads in operation. The mirror arrangement includes a mirror carrier having an optically active surface arranged on a top surface of the mirror carrier. A cooling system is integrated into the mirror carrier. The cooling system has cooling lines through which a cooling fluid circulates. The cooling system is designed so that the thermal load introduced into the mirror carrier via the optically active surface is dissipated at least partially into a rear region remote from the top surface of the mirror carrier.

17 Claims, 5 Drawing Sheets

(56) References Cited

U.S. PATENT DOCUMENTS

| | | | |
|---|---|---|---|
| 2011/0128513 A1* | 6/2011 | Pedrali | G21K 1/06 355/30 |
| 2012/0044474 A1* | 2/2012 | Hauf | G02B 7/1815 355/67 |
| 2012/0188523 A1* | 7/2012 | Kulitsky | G02B 7/00 355/66 |
| 2013/0020511 A1* | 1/2013 | Kameda | G02B 7/1815 250/504 R |
| 2013/0176614 A1 | 7/2013 | Anderl et al. | |
| 2014/0071523 A1 | 3/2014 | Hartjes et al. | |
| 2015/0075751 A1* | 3/2015 | Pharand | G03F 7/70875 165/104.19 |
| 2015/0103426 A1 | 4/2015 | Dengel et al. | |

FOREIGN PATENT DOCUMENTS

| | | |
|---|---|---|
| DE | 10 2011 005 778 A1 | 9/2012 |
| DE | 10 2012 219 540 A1 | 10/2013 |
| DE | 10 2012 210 712 A1 | 1/2014 |
| EP | 2 546 864 A1 | 1/2013 |
| WO | WO 2007/051638 A1 | 5/2007 |
| WO | WO 2012/126830 A1 | 9/2012 |

OTHER PUBLICATIONS

Translation of International Search Report for corresponding PCT Appl No. PCT/EP2017/072982, dated Dec. 21, 2107.

\* cited by examiner

PROJECTION EXPOSURE APPARATUS FOR SEMICONDUCTOR LITHOGRAPHY WITH REDUCE THERMAL DEFORMATION

CROSS-REFERENCE TO RELATED APPLICATIONS

The present application is a continuation of, and claims benefit under 35 USC 120 to, international application PCT/EP2017/072982, filed Sep. 13, 2017, which claims benefit under 35 USC 119 of German Application No. 10 2016 219 357.0, filed Oct. 6, 2016. The entire disclosure of these applications are incorporated by reference herein.

FIELD

The disclosure relates to a projection exposure apparatus for semiconductor lithography, in particular an EUV projection exposure apparatus. Such apparatuses are used for producing very fine structures, in particular on semiconductor components or other microstructured components. The operating principle of the apparatuses is based on the production of very fine structures up to the nanometer range by way of generally reducing imaging of structures on a mask, also referred to as a reticle, on an element to be structured that is provided with photosensitive material, and by way of subsequent further process steps. The minimum dimensions of the structures produced are directly dependent on the wavelength of the light used. Recently, light sources having an emission wavelength in the range of a few nanometers, for example in the range between 1 nm and 30 nm, in particular in the range of 13.5 nm, have been increasingly used. The described wavelength range is also referred to as the EUV range.

BACKGROUND

To guide and condition the emitted light, use is made for example of mirrors referred to as facet mirrors, which generally have a plurality of closely adjacent, relatively small-area mirror facets or micromirror arrays. As regards their orientation, the mirror facets are usually controllable individually or in groups, as are the micromirror arrays. They are generally arranged in recesses in a for example plate-type, flat or curved mirror carrier. During operation of the associated projection exposure apparatus, the mirrors used are exposed to high thermal loads and have to be actively cooled. The thermal loads can stem from the incident electromagnetic, high-energy radiation and also—in particular when micromirror arrays are used—from electrical power loss of electronic components arranged directly beneath the mirror. The heat that arises is discharged usually into the actively cooled mirror carrier.

During operation of the apparatus, the distribution of the illumination intensity and thus the thermal load over the entire surface of the facet mirror often changes. Examples of causes for this that may be mentioned are for example the change in illumination settings (i.e. the intensity distribution of the electromagnetic radiation on the reticle) or the switching on and off of the light source between two wafers or two batches. This change in the thermal load often results in a deformation, in particular in bending of the mirror carrier, this being typically reflected in a change in the orientation of the mirror surfaces and thus in reduced imaging quality of the apparatus as a whole. This can occur in particular because the thermal load arises, on account of the system, on the illuminated side of the mirror arrangement.

In order to compensate for an asymmetric energy input at a mirror arrangement and to reduced thermally induced deformations, WO2012126830A1 suggests providing the mirror arrangement with at least two separate cooling circuits, such that the optically active surface of the mirror arrangement can be cooled more in at least one subregion than in a further subregion. Such a configuration with several cooling circuits is relatively complicated in terms of production and operation, however.

SUMMARY

The disclosure seeks to provide a projection exposure apparatus for semiconductor lithography, which maintains good imaging quality even under changing thermal loads acting on the mirror arrangements used.

In one general aspect, the disclosure provides a projection exposure apparatus for semiconductor lithography. The apparatus includes at least one mirror arrangement with at least one optically active surface, which is arranged on a top surface of a mirror carrier. The apparatus also includes a cooling system integrated in the mirror carrier. The cooling system includes a cooling fluid circulating through cooling lines. The cooling fluid is used to dissipate a thermal load which is introduced into the mirror carrier via the optically active surfaces, at least partially into a rear region, remote from the top surface, of the mirror carrier. The cooling system includes an inlet region adjoining the top surface of the mirror carrier. The inlet region has a cooling fluid feed line. The cooling system also includes an outlet region arranged at a distance from the top surface of the mirror carrier. The outlet region has a cooling fluid drain line. The cooling system further includes one or more connecting lines connecting the inlet region to the outlet region. The connecting lines are designed to impart a throttling action on the flow of coolant between the inlet region and outlet region.

A projection exposure apparatus according to the disclosure for semiconductor lithography contains at least one mirror arrangement with at least one optically active surface, which is arranged on a top surface of a mirror carrier. The mirror carrier contains an integrated cooling system with a cooling fluid circulating through cooling lines, the cooling fluid being used to be able to dissipate a thermal load, introduced into the mirror carrier via the optically active surfaces, at least partially into the region of a rear, remote from the top surface, of the mirror carrier.

Advantageously, the cooling system includes an inlet region, which is located in the immediate vicinity of the top surface of the mirror carrier, and an outlet region at a distance from the top surface of the mirror carrier. The inlet region and the outlet region are connected together via a plurality of connecting lines, which are designed or dimensioned such that they impart a throttling action on the flow of coolant between the inlet region and outlet region. To this end, the connecting lines can be designed in the manner of throttle valves.

The cooling fluid is introduced via a cooling fluid feed line into the inlet region located close to the optically active surfaces and is heated there (on account of the thermal load acting on the optically active surfaces or the top surface of the mirror carrier). The cooling fluid heated in this way then flows through the connecting lines in the form of throttle valves and arrives at the outlet region, from where it is discharged via a cooling fluid drain line. Since the connecting lines throttle the fluid flow, they bring about a uniform backpressure in the inlet region, which ensures that the cooling fluid circulates or dwells in the inlet region and absorbs the heat to be discharged there. Upon subsequently flowing through the connecting lines, the cooling fluid emits the heat to the walls of the connecting lines, the heat being transferred into the adjoining regions of the mirror carrier. In this way, the heat absorbed by the cooling fluid in the inlet region is largely emitted to the regions of the mirror carrier that are remote from the top surface while the cooling fluid flows through the connecting lines and the outlet region. Therefore, the region of the mirror carrier that is remote from the top surface assumes a similar temperature to the region close to the top surface, and the temperature gradient within the mirror carrier is minimized. Thus, the cooling system has the effect that the thermal load introduced into the mirror carrier via the optically active surfaces or the top surface is distributed effectively in the entire mirror carrier. In this way, uniform and symmetric heating of the mirror carrier is achieved, with the result that thermally induced deformations of the mirror arrangement are avoided. Thus, even with varying thermal loads acting on the mirror arrangement, good imaging quality can be maintained.

In order to achieve the throttling action, the connecting lines advantageously have a flow cross section that is smaller than a flow cross section of the inlet region. They thus establish a local flow resistance, which has the effect that the cooling fluid used can circulate or dwell in the inlet region and can effectively cool all the regions exposed to the thermal load. Advantageously, the flow cross section is circular and constant along the entire length of the connecting line; such a cylindrical connecting line is particularly easy to produce, for example by boring. Water or an alcohol, in particular glycol, can be used for example as the cooling fluid. In order to the increase the heat release of the fluid flowing through the connecting lines, the internal surface of the connecting lines can be roughened and/or provided with surface structuring, in order to further increase the flow resistance in the connecting lines.

A throttling action of the connecting lines can furthermore be achieved in that the connecting lines have local cross-sectional narrowings or are designed in a meandering manner. A meandering design is understood to mean a path of the connecting lines that changes direction multiple times, such that the cooling fluid is not guided directly from the inlet region to the outlet region. Similarly, in order to achieve the throttling action, the connecting lines can be provided with obstacles such as meshes or screens or other bodies around which the flow takes place.

Advantageously, the inlet region of the cooling system covers the entire top surface, exposed to the thermal load, of the mirror carrier. This makes it possible to ensure that all the optically active surfaces or the entire top surface of the mirror carrier are supplied with the same amount of cooling fluid.

In the interests of uniform heat dissipation over the top surface of the mirror carrier, it may be advantageous to provide several fluid feed lines distributed along the rim of the mirror carrier. Alternatively or additionally, it may be expedient to vary, over the surface of the mirror carrier, the backpressure exerted by the throttle valves, in that for example the flow cross sections or bore diameters of different connecting lines are configured differently. Thus, it is possible in particular for connecting lines located in the vicinity of a cooling fluid feed line to be provided with a smaller flow cross section/bore diameter than those located farther away, such that these impart a stronger throttling action that those farther away. In this way, a local pressure increase in the fluid feed line can be compensated and a uniform pressure can be generated in the entire inlet region.

A rear side of the mirror carrier that is remote from the top surface of the mirror carrier can be provided with a heating device, with the aid of which the uniform and symmetric heating of the mirror carrier can be increased even further. Such rear-side additional heating is recommended in particular when the outlet region of the cooling device is not arranged in the immediate vicinity of the rear side of the mirror carrier but in a central region of the mirror carrier (i.e. in an intermediate region between the top surface and rear side). In this case, with the aid of the heating device, additional heat is introduced into the rear side of the mirror carrier, in order to compensate the thermal load incident on the top surface of the mirror carrier and to avoid thermally induced deformations of the mirror carrier.

In order to ensure that the rear side of the mirror carrier assumes the temperature of the circulating fluid and heats as far as possible to the same extent as the top surface, the outlet region of the mirror carrier can be provided with a heat exchanger, which is formed preferably by corresponding structuring of a wall adjacent to the rear side (and an associated increase in surface area).

The mirror arrangement can be for example a grazing or normal incidence mirror having an optically active surface continuously covering the top surface of the mirror carrier. Alternatively, the mirror arrangement can be a facet mirror, in which the optically active surfaces are arranged on mirror elements that are engaged at least partially in insertion openings of the mirror carrier.

The mirror carrier consists preferably of stainless steel, aluminum, SiSiC, silicon, Zerodur or ULE. The connecting lines and/or the inlet region and/or the outlet region can be formed in particular by casting methods, pressing methods, 3D printing methods, erosion, etching or cutting manufacturing methods.

From a manufacturing point of view, it is favorable to embody the mirror carrier in multiple parts, with a main body into which a cutout corresponding to the inlet region has been worked (for example via casting, erosion, etching etc.), and a cover, which has been connected to the main body via a joining method, in particular by soldering or welding. A side of the cover remote from the inlet region then forms the top surface of the mirror carrier. Analogously, it is also possible for a cutout corresponding to the outlet region to have been worked into the main body, the cutout being closed by a further cover such that the side of the cover remote from the outlet region forms the rear side of the mirror carrier.

To control the local temperature of the mirror arrangement, temperature sensors can be provided, which are expediently embedded in the mirror carrier.

BRIEF DESCRIPTION OF THE DRAWINGS

Exemplary embodiments and variants of the disclosure are explained in more detail in the following text with reference to the drawing, in which.

DESCRIPTION OF EXEMPLARY EMBODIMENTS

Figure 1:
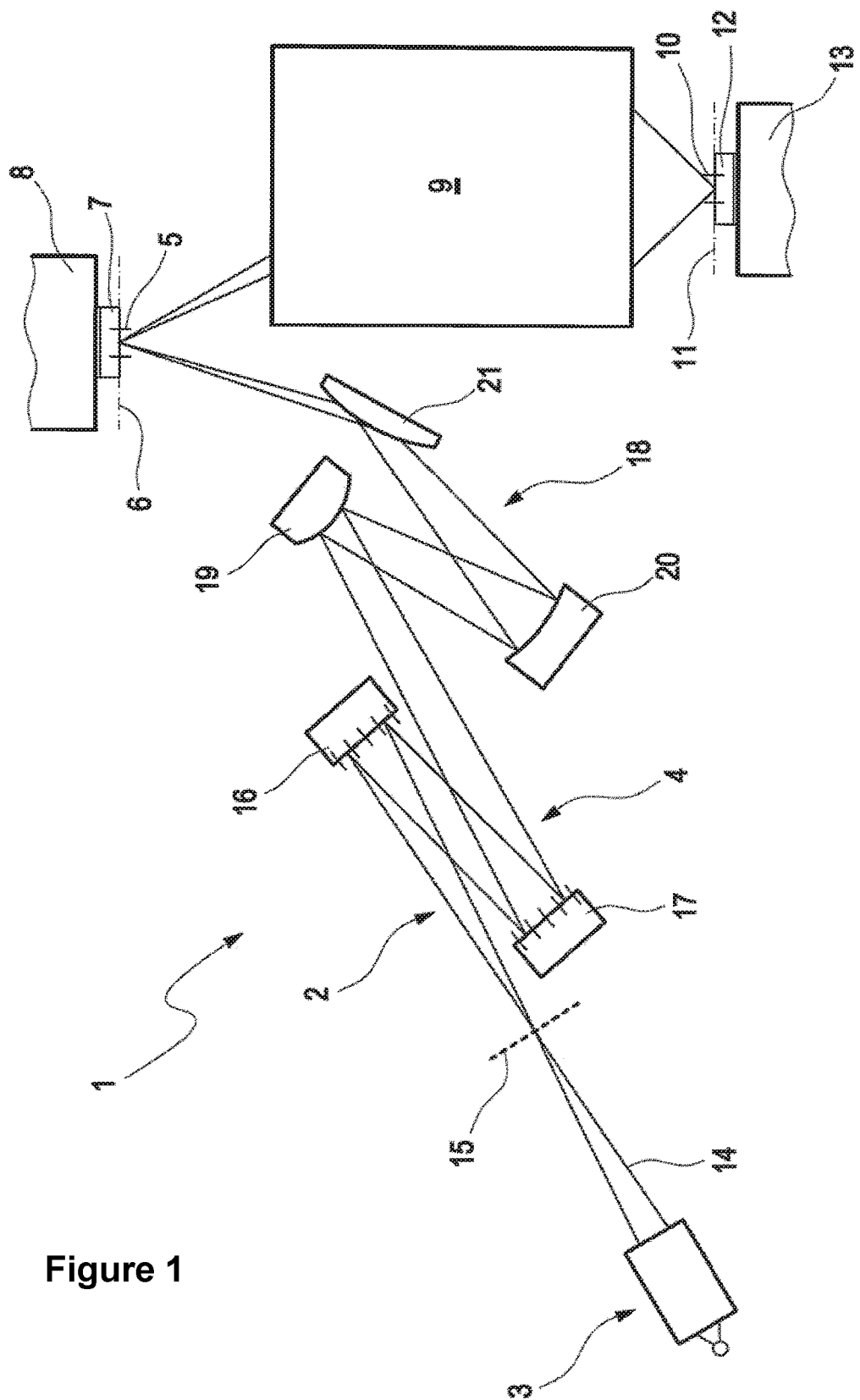
FIG. 1 shows a projection exposure apparatus for semiconductor lithography, in which the disclosure is used.

FIG. 1 shows by way of example the basic structure of a microlithographic EUV projection exposure apparatus 1 in which the disclosure can find application. An illumination system 2 of the projection exposure apparatus 1 has, in addition to a light source 3, an illumination optical unit 4 for the illumination of an object field 5 in an object plane 6. A reticle 7 arranged in the object field 5 is illuminated, the reticle being held by a reticle holder 8, illustrated schematically. A projection optical unit 9, illustrated merely schematically, serves for imaging the object field 5 into an image field 10 in an image plane 11. A structure on the reticle 7 is imaged on a light-sensitive layer of a wafer 12 arranged in the region of the image field 10 in the image plane 11, the wafer being held by a wafer holder 13 that is likewise illustrated in part. The light source 3 can emit used radiation in particular in the range between 5 nm and 30 nm.

EUV radiation 14 generated via the light source 3 is aligned via a collector, which is integrated in the light source 3, in such a way that the radiation passes through an intermediate focus in the region of an intermediate focal plane 15 before it is incident on a field facet mirror 16. Downstream of the field facet mirror 16, the EUV radiation 14 is reflected by a pupil facet mirror 17. With the aid of the pupil facet mirror 17 and an optical assembly 18 having mirrors 19, 20 and 21, field facets of the field facet mirror 16 are imaged into the object field 6.

During operation of the projection exposure apparatus 1, the mirrors used are exposed to high thermal loads, in particular on account of the radiation incident on the mirrors, and have to be actively cooled. Since, on account of the system, the thermal load arises in particular on the illuminated side of the mirrors, deformations, in particular distortions, of the mirrors can occur, which have to be avoided as far as possible in order to ensure high imaging quality of the apparatus 1.

Figure 2A:
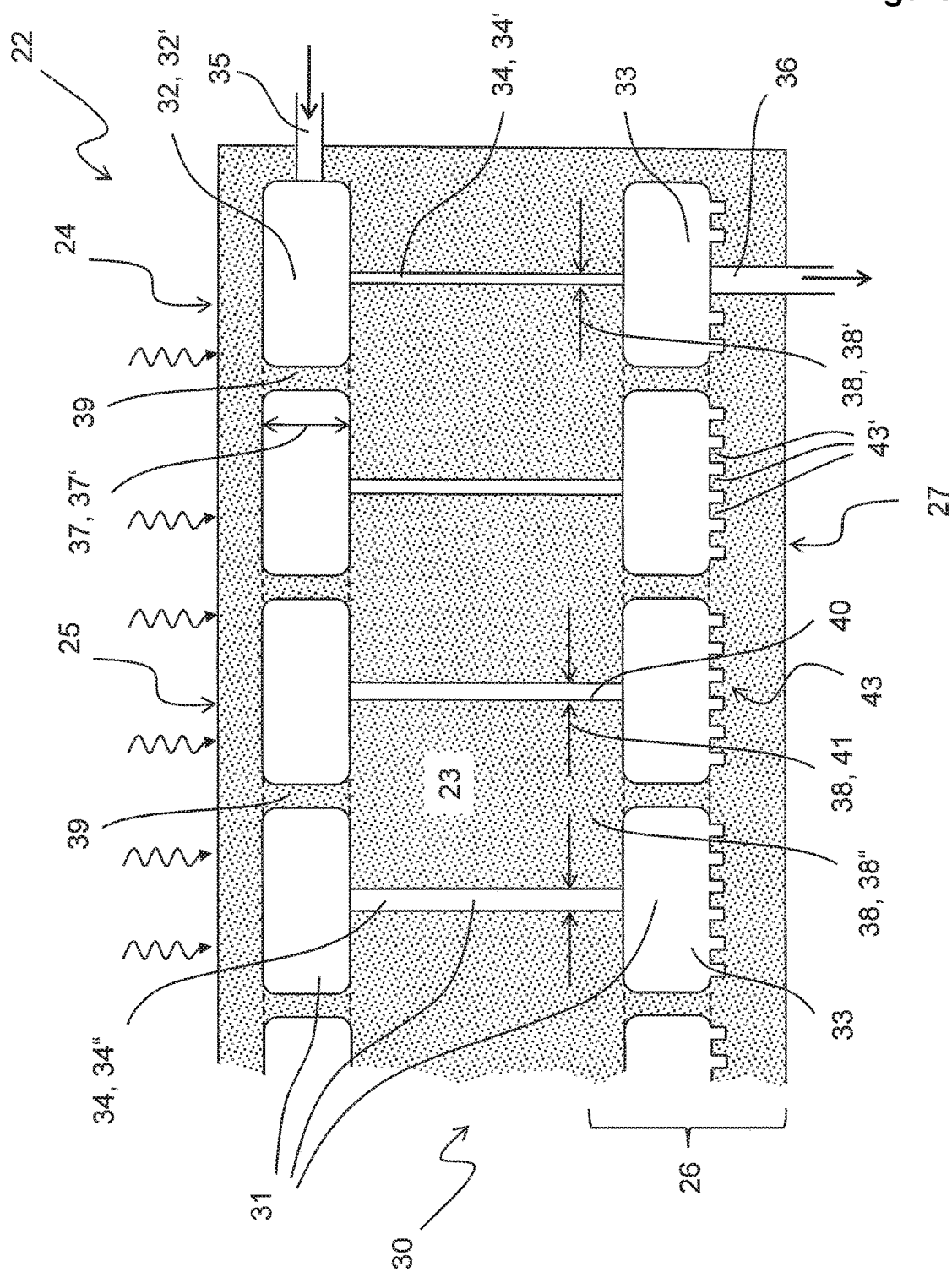
FIG. 2A shows a schematic sectional illustration of a detail of a grazing or normal incidence mirror which has been provided with a deformation-reducing cooling system.

FIG. 2A shows a schematic illustration of a detail of a mirror referred to as a grazing or normal incidence mirror 22 having a mirror carrier 23, the top surface 24 of which that faces the incident radiation has an optically active surface 25, which reflects the incident radiation; the radiation 14 is symbolized by arrows here. In order to avoid local heating of the mirror carrier 23 during operation, the mirror carrier 23 includes an integrated cooling system 30 with cooling lines 31, through which a cooling fluid, not designated separately in the figure, circulates. The cooling fluid discharges the thermal load introduced into the mirror carrier 23 via the optically active surface 25 out of the region of the top surface 24 and introduces it at least partially into a rear region 26, remote from the top surface 24, of the mirror carrier 23. As cooling fluid, use can be made in particular of water, glycol or a liquid metal.

The cooling system 30 includes an inlet region 32, adjacent to the top surface 24 of the mirror carrier 23, and an outlet region 33 arranged in the rear region 26, remote from the top surface 24, of the mirror carrier 23, and also connecting lines 34, which connect the inlet region 32 to the outlet region 33. In order to feed and discharge cooling fluid, a cooling fluid feed line 35 is provided in the inlet region 32 and a cooling fluid drain line 36 is provided in the outlet region 33.

Laterally, i.e. in a plane parallel to the top surface 24 of the mirror carrier 23, the inlet region 32 covers substantially the entire optically active surface 25. The cooling fluid circulating in the inlet region 32 can therefore uniformly absorb and dissipate the thermal energy introduced via the active surface 25. In the exemplary embodiment in FIG. 2A, the inlet region 32 is in the form of a gap 32', extending parallel to the top surface 24, with a clear height 37', wherein the interior of the gap 32' is provided with form-stabilizing spacers 39. The connecting lines 34 are in the form of cylindrical tubes with a diameter 41 that is much smaller than the clear height 37' of the inlet region 32. On account of their small cross section 38—relative to the flow cross section 37 of the inlet region 32—the connecting lines 34 represent throttle valves, which impose a local flow resistance on the cooling fluid as it flows into the connecting lines 34. This has the effect that, before entering the connecting lines 34, the cooling fluid circulates substantially freely in the inlet region 32 and uniformly absorbs the heat introduced via the top surface 24, before it enters the connecting lines 34. On flowing through the connecting lines 34, the cooling fluid transfers the absorbed heat to the mirror carrier 23 via the inner walls 40 of the connecting lines and in this way causes heating of inner regions of the mirror carrier 23 as far as the outlet region 33, where, on account of the shown design of the outlet region 33, it collects and in this way likewise efficiently emits heat in the rear region of the mirror carrier 23. The heat contained in the cooling fluid is thus transported in the direction of the rear region 26 of the mirror carrier 23; as a result of the associated heating of this rear region 26, a temperature gradient in the interior of the mirror carrier 23 and an accompanying deformation of the mirror carrier 23 is avoided or reduced.

In the region of the connecting lines 34' arranged closer to the coolant feed line 35, there is a higher pressure on account of the locally somewhat higher inlet pressure, with the result that the flow rate of the cooling fluid through these connecting lines 34' may be somewhat higher than in the connecting lines 34" arranged farther away from the feed line 35. In order to avoid this effect, which could result in a non-uniform heat distribution in the interior of the mirror carrier 23, the connecting lines 34" farther away from the feed line 35 can be provided with a somewhat larger cross section 38" than the connecting lines 34' closer to the feed line 35 (cross section 38'). The fluid throttling is then somewhat lower in these farther away connecting lines 34" than in the closer connecting lines 34', with the result that the pressure difference brought about by the feed line 35 is compensated. This is illustrated in a greatly exaggerated manner in FIG. 2A.

In order to support heating of the mirror carrier 23 that is as uniform as possible, a heat exchanger structure 43 can be provided in the outlet region 33 of the cooling system 30, it being possible for the heat exchanger structure 43 to be realized for example by structuring of the wall of the outlet region 33 (ribs 43'). The heat exchanger structure 43 is located preferably close to a rear side 27, remote from the top surface 24, of the mirror carrier 23. The increase in surface area achieved by such structuring causes more rapid and more uniform heating of the rear side 27 of the mirror carrier 23 and thus contributes toward reducing temperature gradients in the interior of the mirror carrier 23. The resultant local temperature gradient in the mirror carrier 23 is tolerable for some applications, especially since the majority of the mirror carrier 23 is temperature-controlled uniformly. It is of course also conceivable to form a heat exchanger at a distance from the mirror carrier 23.

Figure 2B:
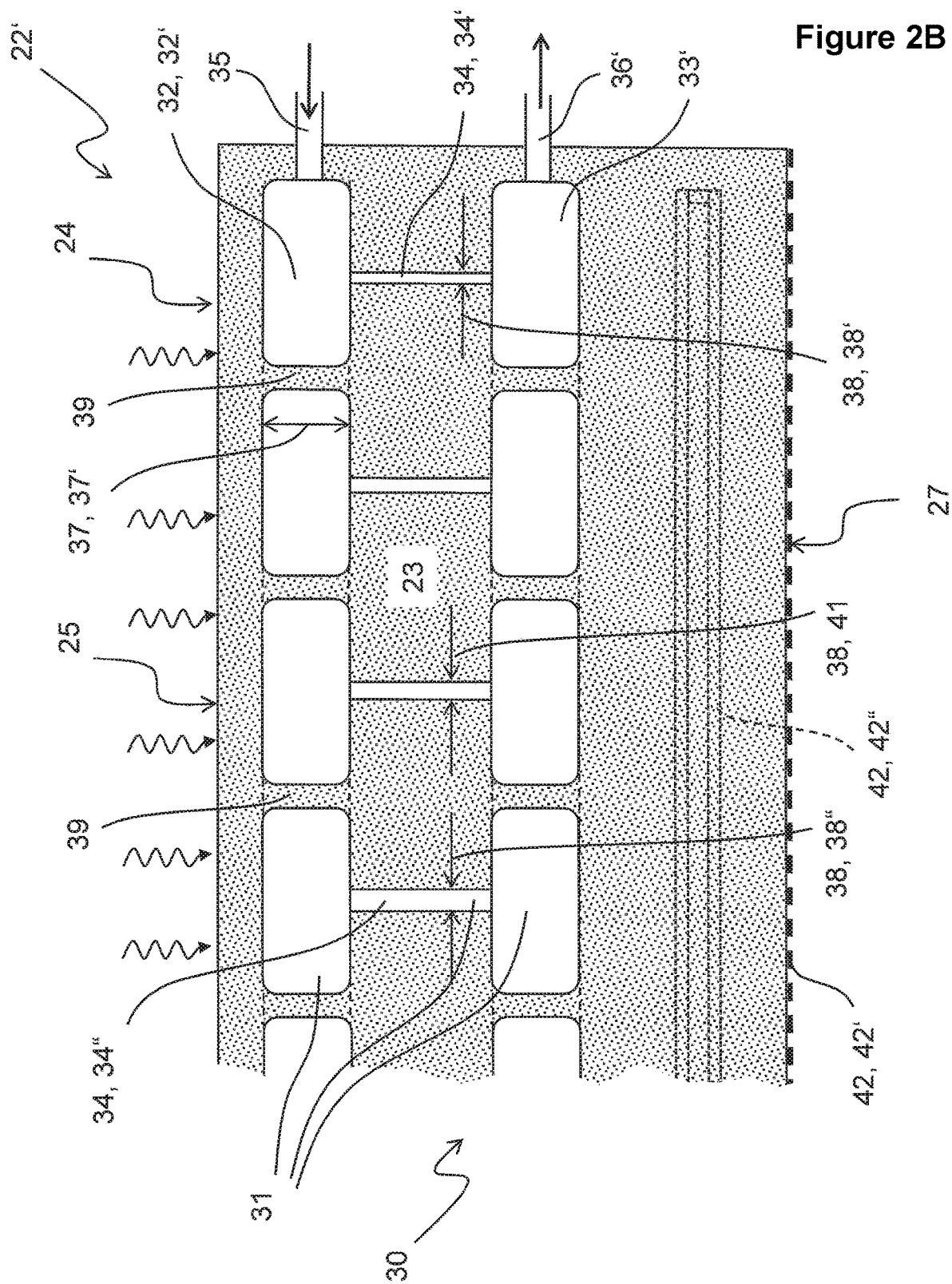
FIG. 2B shows a variant of the grazing or normal incidence mirror illustrated in FIG. 2A, in which a heating device is additionally provided.

FIG. 2B shows a schematic sectional illustration of a grazing or normal incidence mirror 22', in which the outlet region 33' of the cooling system 30—in contrast to the configuration in FIG. 2A—is arranged not in the rear region 26 of the mirror carrier 23, but in a central region, between the top surface 24 and the rear side 27 of the mirror carrier 23. Such an arrangement is advantageous in particular when the cooling fluid cannot—as shown in FIG. 2A—be discharged through the rear side 27 of the mirror carrier 23. In this case, it is recommended to provide, in the region of the rear side 27 of the mirror carrier 23, a heating device 42 with which heat can be introduced into this region of the mirror carrier 23 in order to compensate the thermal load fed in via the top surface. The heating device 42 can be realized in particular by a heating foil 42' applied to the rear side 27 or a heating device 42" (illustrated by dashed lines in FIG. 2B) integrated into the mirror carrier 23. Alternatively, the heating device can also be formed by an infrared heater directed toward the rear side 27 of the mirror carrier 23.

Figure 3A:
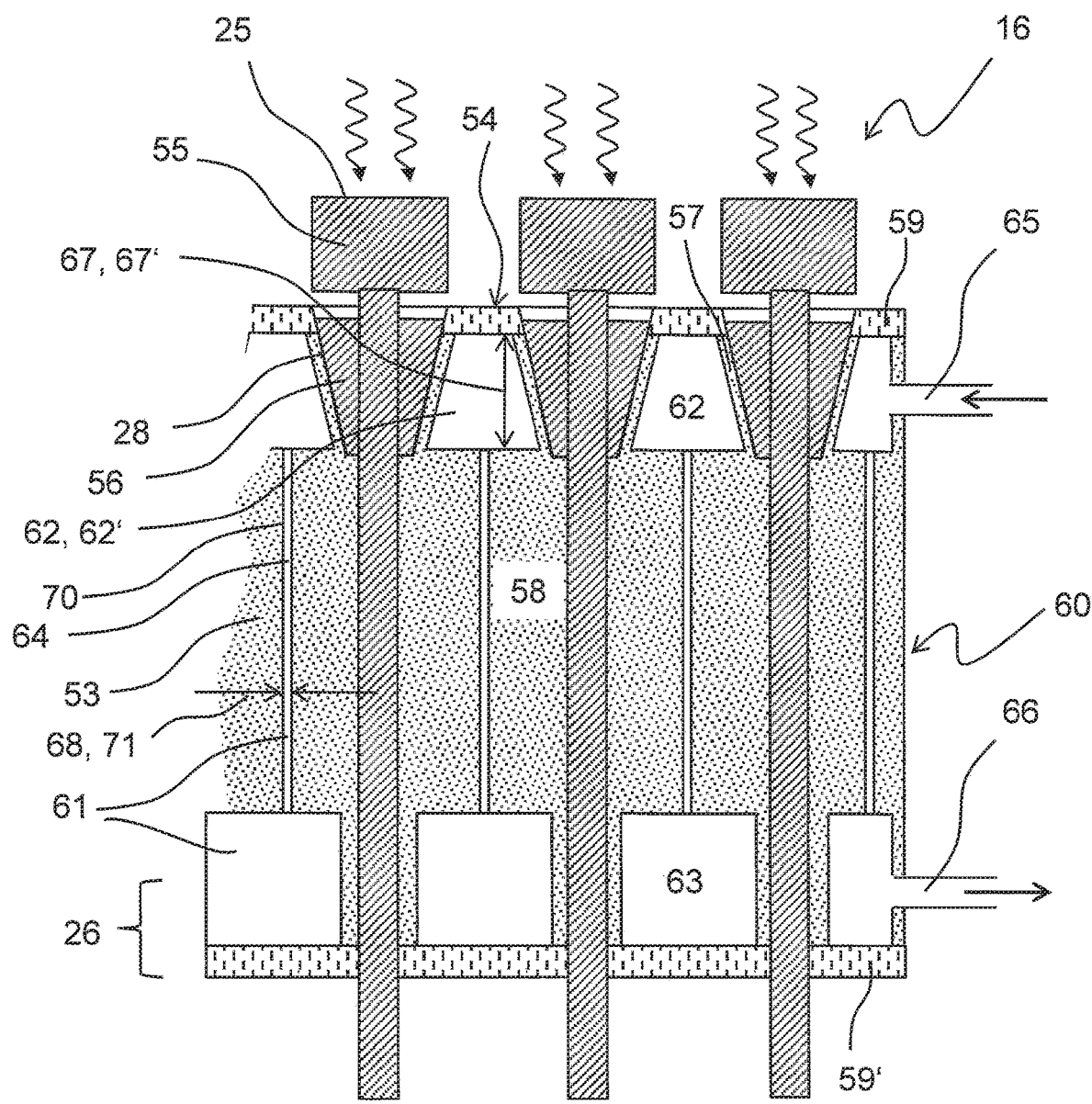
FIG. 3A shows a schematic sectional illustration of a detail of a facet mirror which has been provided with a deformation-reducing cooling system.

FIG. 3A shows a schematic illustration of a detail of a mirror referred to as a facet mirror 16. The facet mirror includes a mirror carrier 53 having insertion openings 28 into which a plurality of mirror elements 55 have been inserted. Each of the mirror elements 55 has an optically active surface 25, facing the incident radiation, which reflects the incident radiation. The insertion openings 28 are shaped in a conical manner in the region of the top surface 54 of the mirror carrier 53, in order to receive a corresponding conically shaped contact region 56 of the mirror elements 55. Via this contact region 56, a thermal load introduced into the mirror elements 55 via the optically active surfaces 25 can be transferred to the mirror carrier 53. In order to avoid heating of the mirror carrier 53 here, the mirror carrier 53 includes an integrated cooling system 60 having cooling lines 61, through which a cooling fluid circulates, which discharges the thermal load, introduced into the mirror carrier 53 via the contact regions 56 of the mirror elements 55, out of the region of the insertion openings 28 and introduces it at a rear region 26, remote from the optical surfaces 25, of the mirror carrier 53.

Analogously to the exemplary embodiment of FIG. 2A, the cooling system 60 includes an inlet region 62, surrounding the contact region 56 of the mirror elements 55, and an outlet region 63 arranged in the rear region 26, remote from the contact regions 56, of the mirror carrier 53, and also connecting lines 64, which connect the inlet region 62 to the outlet region 63. In order to feed and discharge cooling fluid, a cooling fluid feed line 65 is provided in the inlet region 62 and a cooling fluid drain line 66 is provided in the outlet region 63.

Laterally, i.e. in a plane parallel to the optically active surfaces 25 of the mirror elements 55, the inlet region 62 of the cooling system 60 covers substantially the entire optically active surface 25, such that the cooling fluid circulating in the inlet region 62 can uniformly absorb and dissipate the heat introduced via the active surface 25. The inlet region 62 is in the form of a gap 62' with a clear height 67', into which rotationally symmetric webs 57 that surround the conical contact regions 56 of the mirror elements 55 project. The inlet region 62 thus forms a large reservoir. The connecting lines 64 are in the form of cylindrical tubes with a diameter 71 that is much smaller than the clear height 67' of the inlet region 62. Since the flow cross section 68 of the flow lines 64 is much smaller than the flow cross section 67 of the inlet region 62, the connecting lines 64 therefore act as throttle valves and impose a local flow resistance on the cooling fluid when it flows into the connecting lines 64. The cooling fluid introduced through the feed line 35 circulates in the inlet region 62 and absorbs the heat introduced via the conical contact regions 56 of the mirror elements 55 there, before it enters the connecting lines 64 and transfers the absorbed heat there to the mirror carrier 53 via inner walls 70 of the connecting lines 64. In this way, the entire mirror carrier 53 as far as the outlet region 63 is heated, with the result that a temperature gradient and an accompanying deformation of the mirror carrier 53 is avoided or reduced. The throttle valves of the connecting lines 64 ensure that all mirror elements 55 are supplied with the same amount of cooling fluid in that they ensure a uniform build-up of pressure in the inlet region 62.

Figure 3B:
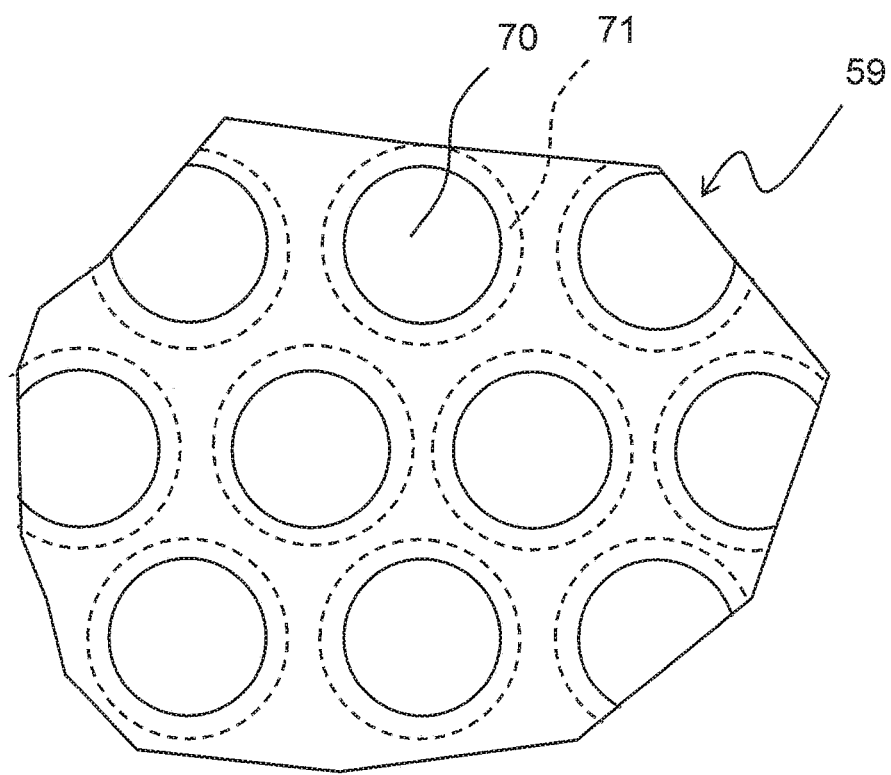
FIG. 3B shows a schematic plan view of the illustrated cover of the mirror carrier of FIG. 3A.

In the exemplary embodiment in FIG. 3A, the mirror carrier 53 is embodied in multiple parts and includes a main body 58, into which the structures of the inlet and outlet region 62, 63 have been worked, for example milled or etched. Furthermore, the mirror carrier 53 includes covers 59, 59', which close off the inlet and outlet region 62, 63 from the outside and have been connected to the main body 58 of the mirror carrier 53, in particular soldered or welded thereto. The inlet region 62 is thus delimited on its top side (facing the optically active surfaces 25) by the cover 59, which has been soldered or welded onto the main body 58 in the region of the webs 57. Similarly, the outlet region 63 is delimited on its rear side (remote from the optically active surfaces 25) by the cover 59', which has likewise been soldered or welded onto the main body 58. FIG. 3B shows a schematic plan view of a region of the cover 59 with cutouts 70 for the mirror elements 55 and annular soldering or welding regions 71.

It goes without saying that the technical solutions shown in the figures do not entirely preclude one another. If desired, a person skilled in the art will make suitable sub-combinations of the technical features shown.

What is claimed is:

1. An apparatus, comprising:
a mirror comprising a mirror carrier and an optically active surface arranged on a surface of the mirror carrier,
wherein:
the mirror carrier comprises a cooling system integrated therein;
the cooling system comprises:
cooling lines;
an inlet region adjoining the surface of the mirror carrier, the inlet region comprising a cooling fluid feed line;
an outlet region arranged at a distance from the surface of the mirror carrier, the outlet region comprising a cooling fluid drain line; and
a plurality of connecting lines comprising first and second connecting lines, each connecting line connecting the inlet and outlet regions of the mirror carrier;
the apparatus is configured so that, during use of the apparatus when a cooling fluid circulates through the cooling lines, the cooling fluid dissipates a thermal load introduced into the mirror carrier via the optically active surface of the mirror, at least partially into a region of the mirror carrier which is remote from the surface of the mirror carrier;
the connecting lines are configured to throttle flow of cooling fluid between the inlet and outlet regions;

the first connecting line has a first flow cross section;
the second connecting line has a second flow cross section;
the first connecting line is closer to the cooling fluid feed line than the second connecting line;
the first flow cross section is less than the second flow cross section; and
the apparatus is a semiconductor lithography projection exposure apparatus.

2. The apparatus of claim 1, wherein a minimum cross section of the first connecting line is less than a minimum cross section of the inlet region of the mirror carrier.

3. The apparatus of claim 1, wherein the inlet region of the mirror carrier covers substantially an entirety of the optically active surface the mirror, and/or the inlet region of the mirror carrier covers substantially all of the surface of the mirror carrier.

4. The apparatus of claim 1, wherein the cooling fluid comprises water or an alcohol.

5. The apparatus of claim 1, wherein the mirror carrier comprises a heating device in the region of remote from the top surface of the mirror carrier.

6. The apparatus of claim 1, wherein the outlet region of the mirror carrier comprises a heat exchanger.

7. The apparatus of claim 1, wherein the mirror comprises a grazing incidence mirror or a normal incidence mirror.

8. The apparatus of claim 1, wherein the mirror comprises a facet mirror.

9. The apparatus of claim 8, wherein the optically active surface of the mirror is arranged on a mirror element of the facet mirror that is at least partially engaged in an insertion opening of the mirror carrier.

10. The apparatus of claim 1, wherein the mirror comprises a plurality of micromirror arrays.

11. The apparatus of claim 1, wherein the mirror carrier comprises stainless steel, aluminum, SiSiC, silicon, Zerodur or ULE.

12. The apparatus of claim 1, wherein at least one member selected from the group consisting of the connecting line, the inlet region of the mirror carrier and the outlet region of the mirror carrier is formed by casting methods, pressing methods, 3D printing methods, erosion, etching or cutting manufacturing methods.

13. The apparatus of claim 1, wherein the mirror carrier comprises multiple parts.

14. The apparatus of claim 13, wherein the inlet region of the mirror carrier is delimited on a side facing the optically active surface by a cover connected to a main body of the mirror carrier via a joining method.

15. The apparatus of claim 13, wherein the outlet region of the mirror carrier of the cooling system is delimited on its side remote from the optically active surface by a cover connected to a main body of the mirror carrier via a joining method.

16. The apparatus of claim 13, wherein:
a side of the inlet region of the mirror carrier facing the optically active surface is soldered or welded to a main body of the mirror carrier; and
a side of the outlet region of the mirror carrier remote from the optically active surface is soldered or welded to the main body of the mirror carrier.

17. The apparatus of claim 1, wherein the mirror arrangement comprises temperature sensors.

* * * * *

UNITED STATES PATENT AND TRADEMARK OFFICE
CERTIFICATE OF CORRECTION

PATENT NO. : 10,606,179 B2
APPLICATION NO. : 16/368278
DATED : March 31, 2020
INVENTOR(S) : Hermann Bieg It is certified that error appears in the above-identified patent and that said Letters Patent is hereby corrected as shown below:

In the Claims

Column 9, Line 15, Claim 3, after "surface" insert -- of --.

Signed and Sealed this
Twenty-sixth Day of May, 2020

Andrei Iancu
*Director of the United States Patent and Trademark Office*